(12) United States Patent
Chang Chien et al.

(10) Patent No.: US 10,541,198 B2
(45) Date of Patent: Jan. 21, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chien Lin Chang Chien, Kaohsiung (TW); Chin-Li Kao, Kaohsiung (TW); Chang Chi Lee, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/884,197

(22) Filed: Jan. 30, 2018

(65) Prior Publication Data

US 2018/0158766 A1 Jun. 7, 2018

Related U.S. Application Data

(60) Division of application No. 15/479,074, filed on Apr. 4, 2017, now Pat. No. 9,917,043, which is a
(Continued)

(51) Int. Cl.
*H01L 23/498* (2006.01)
*H01L 23/00* (2006.01)
(Continued)

(52) U.S. Cl.
CPC .... *H01L 23/49816* (2013.01); *H01L 21/6835* (2013.01); *H01L 23/16* (2013.01);
(Continued)

(58) Field of Classification Search
CPC .... H01L 23/49816; H01L 24/81; H01L 25/50
See application file for complete search history.

(56) References Cited

U.S. PATENT DOCUMENTS

| 7,446,424 | B2 | 11/2008 | Lu et al. |
| 8,829,676 | B2 | 9/2014 | Yu et al. |

(Continued)

FOREIGN PATENT DOCUMENTS

| CN | 103915374 A | 7/2014 |
| CN | 104008981 A | 8/2014 |
| CN | 104051383 A | 9/2014 |

OTHER PUBLICATIONS

Non-Final Office Action for corresponding U.S. Appl. No. 15/479,074 dated Aug. 8, 2017, 14 pages.
(Continued)

*Primary Examiner* — Walter H Swanson
(74) *Attorney, Agent, or Firm* — Foley & Lardner LLP; Cliff Z. Liu

(57) ABSTRACT

A method of manufacturing a semiconductor package includes: (a) providing a carrier; (b) disposing a dielectric layer and a conductive pad on the carrier; (c) disposing a redistribution layer on the dielectric layer to electrically connect to the conductive pad; (d) connecting a die to the redistribution layer; (e) removing at least a portion of the carrier to expose the conductive pad; and (f) disposing an electrical contact to electrically connect to the conductive pad.

18 Claims, 6 Drawing Sheets

Related U.S. Application Data continuation-in-part of application No. 15/404,093, filed on Jan. 11, 2017.

(60) Provisional application No. 62/326,678, filed on Apr. 22, 2016, provisional application No. 62/277,776, filed on Jan. 12, 2016, provisional application No. 62/279,263, filed on Jan. 15, 2016.

(51) Int. Cl.

| | |
|---|---|
| *H01L 25/00* | (2006.01) |
| *H01L 23/16* | (2006.01) |
| *H01L 23/522* | (2006.01) |
| *H01L 23/528* | (2006.01) |
| *H01L 25/065* | (2006.01) |
| *H01L 21/683* | (2006.01) |
| *H01L 21/48* | (2006.01) |
| *H01L 23/31* | (2006.01) |

(52) U.S. Cl.
CPC .. *H01L 23/49838* (2013.01); *H01L 23/49894* (2013.01); *H01L 23/528* (2013.01); *H01L 23/5226* (2013.01); *H01L 24/16* (2013.01); *H01L 24/81* (2013.01); *H01L 25/0655* (2013.01); *H01L 25/50* (2013.01); *H01L 21/4853* (2013.01); *H01L 23/3128* (2013.01); *H01L 23/49822* (2013.01); *H01L 23/49827* (2013.01); *H01L 23/49833* (2013.01); *H01L 23/562* (2013.01); *H01L 2221/68331* (2013.01); *H01L 2224/16235* (2013.01); *H01L 2224/16238* (2013.01); *H01L 2224/73204* (2013.01); *H01L 2224/81005* (2013.01); *H01L 2224/81193* (2013.01); *H01L 2224/83005* (2013.01); *H01L 2924/14* (2013.01); *H01L 2924/1433* (2013.01); *H01L 2924/1434* (2013.01); *H01L 2924/15311* (2013.01); *H01L 2924/19041* (2013.01); *H01L 2924/19043* (2013.01); *H01L 2924/19105* (2013.01); *H01L 2924/3512* (2013.01)

(56) References Cited

U.S. PATENT DOCUMENTS

| | | |
|---|---|---|
| 8,841,751 B2 | 9/2014 | Wang et al. |
| 8,946,884 B2 | 2/2015 | Kwon et al. |
| 9,000,586 B2 | 4/2015 | Do et al. |
| 9,230,902 B2 | 1/2016 | Yu et al. |
| 9,431,320 B2 | 8/2016 | Carrillo-Ramirez |
| 2008/0006931 A1 | 1/2008 | Oliver et al. |
| 2011/0026232 A1 | 2/2011 | Lin et al. |
| 2011/0169150 A1 | 7/2011 | Su et al. |
| 2013/0187269 A1 | 7/2013 | Lin et al. |
| 2013/0292808 A1 | 11/2013 | Yen et al. |
| 2014/0177189 A1 | 6/2014 | Liu et al. |
| 2014/0191392 A1 | 7/2014 | Tu et al. |
| 2014/0210080 A1* | 7/2014 | Chang ............... H01L 24/19 257/738 |
| 2014/0242791 A1 | 8/2014 | Yu et al. |
| 2016/0013124 A1* | 1/2016 | Chen ............... H01L 21/78 257/774 |
| 2016/0155723 A1* | 6/2016 | Lou ............... H01L 25/0657 257/774 |

OTHER PUBLICATIONS

Notice of Allowance for corresponding U.S. Appl. No. 15/479,074 dated Nov. 17, 2017, 7 pages.

Non-Final Office Action for U.S. Appl. No. 15/404,093, dated Mar. 12, 2018, 12 pages.

Office Action from corresponding Chinese Patent Application No. 201710256395.5, dated Jun. 25, 2018, 5 pages.

Search Report from corresponding Chinese Patent Application No. 201710256395.5, dated Jun. 25, 2018, 3 pages.

Final Office Action for U.S. Appl. No. 15/404,093, dated Jul. 25, 2019, 9 pages.

Notice of Allowance in U.S. Appl. No. 15/404,093, dated Nov. 14, 2019, 9 pages.

* cited by examiner

SEMICONDUCTOR PACKAGE DEVICE AND METHOD OF MANUFACTURING THE SAME

CROSS-REFERENCE TO RELATED APPLICATIONS

This application is a divisional of U.S. patent application Ser. No. 15/479,074, filed Apr. 4, 2017, which claims the benefit of and priority to U.S. Provisional Patent Application No. 62/326,678, filed Apr. 22, 2016, the contents of which are incorporated herein by reference in its entirety. This application is a continuation-in-part of, and claims the benefit of and priority to, U.S. patent application Ser. No. 15/404,093, filed Jan. 11, 2017, which claims the benefit of and priority to U.S. Provisional Patent Application No. 62/277,776, filed Jan. 12, 2016 and U.S. Provisional Patent Application No. 62/279,263, filed Jan. 15, 2016, the contents of which are incorporated herein by reference in its entirety.

BACKGROUND

1. Technical Field

The present disclosure relates generally to a semiconductor package device and a method of manufacturing the same. More particularly, the present disclosure relates to a semiconductor package device including a stacking structure and a method of manufacturing the same.

2. Description of the Related Art

In comparable three-dimensional semiconductor packages, one or more semiconductor devices (e.g., a processing unit or memory) may be attached to a substrate (e.g., ball grid array (BGA) substrate) by way of an interposer, where through-silicon vias (TSVs) in the interposer provide electrical connection between the semiconductor devices and the substrate. However, the use of the TSV interposer would increase a total thickness or height of the semiconductor package.

SUMMARY

In one or more embodiments, a method of manufacturing a semiconductor package includes: (a) providing a carrier; (b) disposing a dielectric layer and a conductive pad on the carrier; (c) disposing a redistribution layer on the dielectric layer to electrically connect to the conductive pad; (d) connecting a die to the redistribution layer; (e) removing at least a portion of the carrier to expose the conductive pad; and (f) disposing an electrical contact to electrically connect to the conductive pad.

In one or more embodiments, a method of manufacturing a semiconductor package includes: (a) providing a first carrier; (b) disposing a redistribution layer and a first electrical contact on the first carrier, wherein the first electrical contact is covered by the first carrier; (c) disposing a dielectric layer and a conductive pad on the redistribution layer, wherein the conductive pad is electrically connected to the redistribution layer, the dielectric layer has a second carrier thereon, and the second carrier has an opening to expose a portion of the conductive pad; and (d) forming a conductive layer on the second carrier and within the opening to contact the conductive pad exposed from the second carrier.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
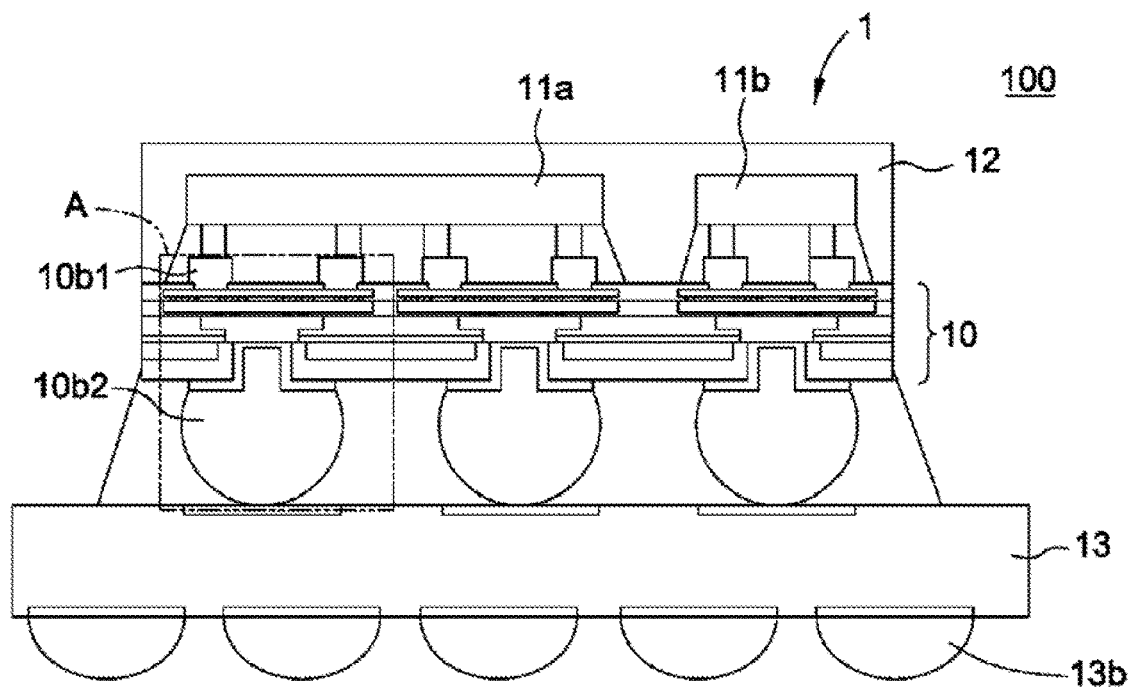
FIG. 1A illustrates a cross-sectional view of a semiconductor package in accordance with some embodiments of the present disclosure.

FIG. 1A illustrates a cross-sectional view of a semiconductor package 100 in accordance with some embodiments of the present disclosure. The semiconductor package 100 includes a semiconductor package device 1, an interposer 10 and a substrate 13.

The substrate 13 may be a flexible substrate or a rigid substrate, depending upon the specific application. In some embodiments, the substrate 13 includes a plurality of electrical traces disposed therein. In some embodiments, an external contact layer is also formed or disposed on the substrate 13. In some embodiments, the external contact layer includes a ball grid array (BGA). In other embodiments, the external contact layer includes an array such as, but not limited to, a land grid array (LGA) or an array of pins (PGA). In some embodiments, the external contact layer includes solder balls 13b, which are used and are composed of lead or are lead free (e.g., including such materials as alloys of gold and tin solder or silver and tin solder).

The semiconductor package device 1 is disposed over the substrate 13. The semiconductor package device 1 includes electronic components 11a, 11b and a package body 12. Each of the electronic components 11a, 11b includes a plurality of semiconductor devices, such as, but not limited to, transistors, capacitors and resistors interconnected together by a die interconnection structure into functional circuits to thereby form an integrated circuit. As will be understood to those skilled in the art, the device side of the semiconductor die includes an active portion including integrated circuitry and interconnections. The electronic components 11a, 11b may be any suitable integrated circuit device including, but not limited to, a microprocessor (e.g., single or multi-core), a memory device, a chipset, a graphics device, or an application specific integrated circuit according to several different embodiments.

The package body 12 is disposed to cover or encapsulate the electronic components 11a, 11b. In some embodiments, the package body 12 includes an epoxy resin including fillers, a molding compound (e.g., an epoxy molding compound or other molding compound), a polyimide, a phenolic compound or material, a material including a silicone dispersed therein, or a combination thereof.

The interposer 10 is disposed between the semiconductor package device 1 and the substrate 13 to provide electrical connections therebetween. The electronic components 11a, 11b are electrically connected to electrical contacts 10b1 (such as micro-pads) on the interposer 10. The interposer 10 is electrically connected to the substrate 13 through electrical contacts 10b2 (such as Controlled Collapse Chip Connection (C4) pads). In some embodiments, the electrical contacts 10b1, 10b2 can be covered or encapsulated by an underfill.

Figure 1B:
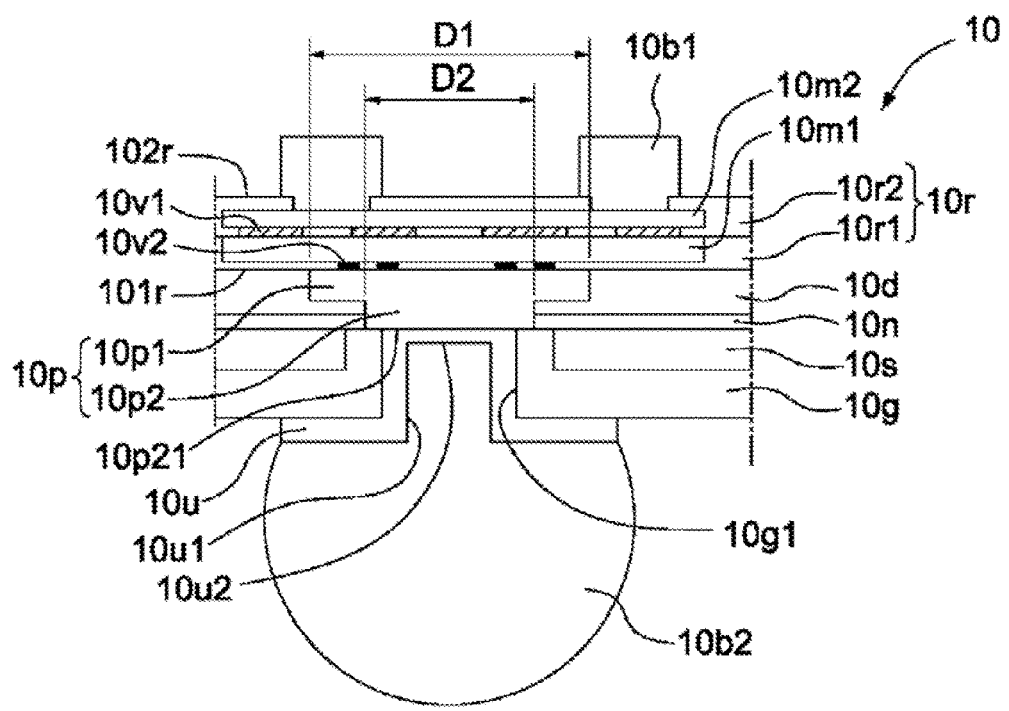
FIG. 1B illustrates an enlarged view of a portion of the semiconductor package shown in FIG. 1A in accordance with some embodiments of the present disclosure.

FIG. 1B illustrates an enlarged view of a portion of the semiconductor package 100 encircled by the rectangle A shown in FIG. 1A, in accordance with some embodiments of the present disclosure. The interposer 10 includes a redistribution layer (RDL) 10r, dielectric layers 10d and 10n, a silicon layer 10s, a passivation layer 11g and a conductive pad 10p.

In some embodiments, the RDL 10r includes stacked interlayer dielectrics (ILD) 10r1, 10r2 and conductive layers 10m1, 10m2 (e.g., metal layers) integrated into the interlayer dielectrics 10r1, 10r2 in spaced relation to each other (e.g., spaced from each other). The conductive layers 10m1, 10m2 are respectively encapsulated or covered by the ILDs 10r1, 10r2. The conductive layers 10m1, 10m2 are electrically connected through conductive interconnections 10v1 (e.g., vias). In some embodiments, the conductive layers 10r1, 10r2 are formed or disposed by a thermal spraying technique in which melted (or heated) materials are sprayed onto a surface. In some embodiments, the RDL 10r may include any number of ILDs and conductive layers according to several different embodiments. For example, the RDL 10r may include N ILDs and conductive layers, where N is an integer. In some embodiments, the ILD 10r2 includes openings to expose a portion of the conductive layer 10m2. The electrical contacts 10b1 are disposed on a surface (e.g., second surface) 102r of the RDL 10r and extend into the openings to electrically contact the exposed portions of the conductive layer 10m2.

The conductive pad 10p is disposed on a surface (e.g., first surface) 101r of the RDL 10r and is electrically connected to the conductive layer 10m1 through conductive interconnections 10v2 (e.g., vias). In some embodiments, a height of the conductive interconnections 10v2 is less than about 1 micrometer (μm). The conductive pad 10p includes a first portion 10p1 disposed on the surface 101r of the RDL 10r and a second portion 10p2 contacting the first portion 10p1. A width D1 of the first portion 10p1 is greater than a width D2 of the second portion 10p2.

The dielectric layer 10d is disposed on the surface 101r of the RDL 10r to encapsulate or cover the first portion 10p1 of the conductive pad 10p and a portion of a sidewall of the second portion 10p2 of the conductive pad 10p. In some embodiments, the dielectric layer 10d may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

The dielectric layer 10n is disposed on the dielectric layer 10d to encapsulate or cover the remaining portion of sidewall of the second portion 10p2 of the conductive pad 10p that is not covered by the dielectric layer 10d. In some embodiments, a surface 10n1 of the dielectric layer 10n is substantially coplanar with a surface 10p21 of the second portion 10p2 of the conductive pad 10p. In some embodiments, the dielectric layer 10n and the dielectric layer 10d are formed of different materials. For example, the dielectric layer 10n may be formed of silicon nitride, while the dielectric layer 10d may be formed of silicon oxide. In other embodiments, the dielectric layer 10n and the dielectric layer 10d are formed of the same material.

The silicon layer 10s is disposed on the surface 10n1 of the dielectric layer 10n. The silicon layer 10s includes an opening to expose the surface 10p21 of the second portion 10p2 of the conductive pad 10p. In some embodiments, a thickness of the silicon layer 10s is in a range from about 10 μm to about 30 μm.

The passivation layer 10g is disposed on the silicon layer 10s and extends into the opening of the silicon layer 10s to cover a portion of the surface 10p21 of the second portion 10p2 of the conductive pad 10p. In some embodiments, the passivation layer 10g includes silicon oxide, silicon nitride, gallium oxide, aluminum oxide, scandium oxide, zirconium oxide, lanthanum oxide or hafnium oxide.

A conductive layer 10u (e.g., under bump metallurgy (UBM)) is disposed on the passivation layer 10g and extends into the opening of the silicon layer 10s to contact the remaining portion of the surface 10p21 of the second portion 10p2 of the conductive pad 10p that is not covered by the passivation layer 10g. For example, the conductive layer 10u contacts sidewalls 10g1 of the passivation layer 10g and the surface 10p21 of the second portion 10p2 of the conductive pad 10p.

The electrical contact 10b2 (e.g., C4 pad) is disposed on the conductive layer 10u and extends into a recess defined by the conductive layer 10u. In some embodiments, the electrical contact 10b2 electrically contacts sidewalls 10u1 and a bottom surface 10u2 of the recess defined by the conductive layer 10u.

As mentioned above, a comparable TSV interposer would increase the total thickness of the semiconductor device. In accordance with some embodiments, the electrical contact 10b2 and the electrical contact 10b1 are electrically connected through the conductive layers 10u, 10m1, 10m2, the conductive pad 10p and the conductive interconnections 10v1, 10v2, so as to provide electrical connections between the semiconductor package device 1 and the substrate 13. Hence, the total thickness of the semiconductor package 100 can be reduced.

Figure 1C:
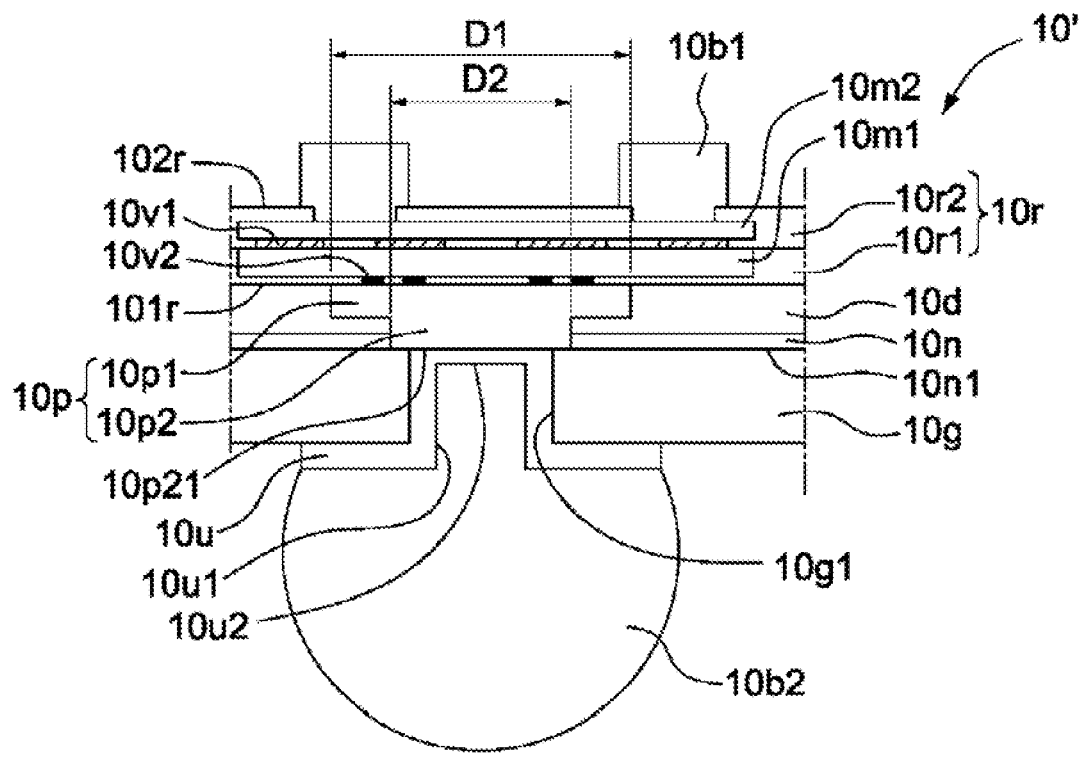
FIG. 1C illustrates an enlarged view of a portion of the semiconductor package shown in FIG. 1A in accordance with some embodiments of the present disclosure.

FIG. 1C illustrates an enlarged view of a portion of the semiconductor package 100 encircled by the rectangle A shown in FIG. 1A, in accordance with some embodiments of the present disclosure. The interposer 10' shown in FIG. 1C is similar to the interposer 10 shown in FIG. 1B except that the interposer 10' lacks the silicon layer 10s. In some embodiments, the passivation layer 10g is disposed on the surface 10n1 of the dielectric layer 10n. The passivation layer 10g includes an opening to expose an entirety or a portion of the surface 10p21 of the second portion 10p2 of the conductive pad 10p.

FIGS. 2A, 2B, 2C, 2D and 2E are cross-sectional views of a semiconductor structure fabricated at various stages, in accordance with some embodiments of the present disclosure. Various figures have been simplified for a better understanding of the aspects of the present disclosure.

Figure 2A:
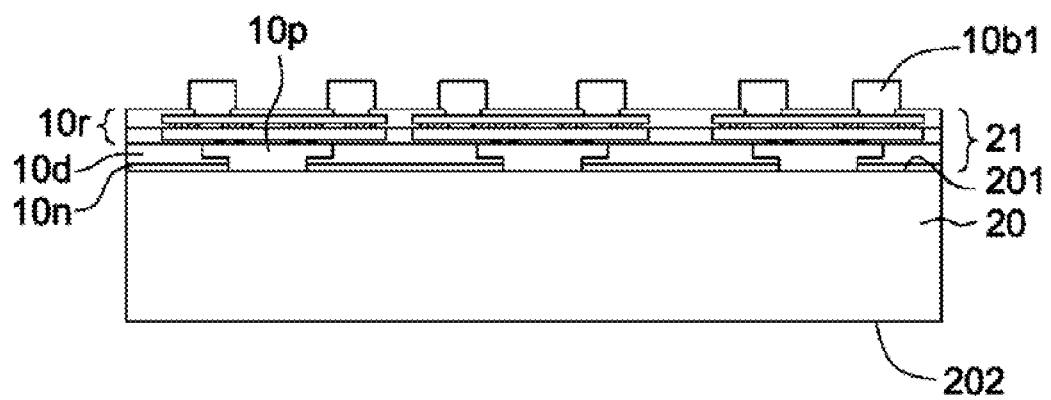
FIG. 2A, FIG. 2B, FIG. 2C, FIG. 2D and FIG. 2E illustrate a method of manufacturing a semiconductor package in accordance with some embodiments of the present disclosure.

Referring to FIG. 2A, a base 20 is provided. The base 20 includes a silicon carbide (SiC) substrate, a sapphire substrate or a silicon substrate. An interconnection structure 21 is then formed or disposed on a surface (e.g., first surface) 201 of the base 20. In some embodiments, the interconnection structure 21 may include the RDL 10r, the conductive pad 10p, the dielectric layers 10d and 10n, and the electrical contacts 10b1 as shown in FIG. 1B.

Figure 2B:
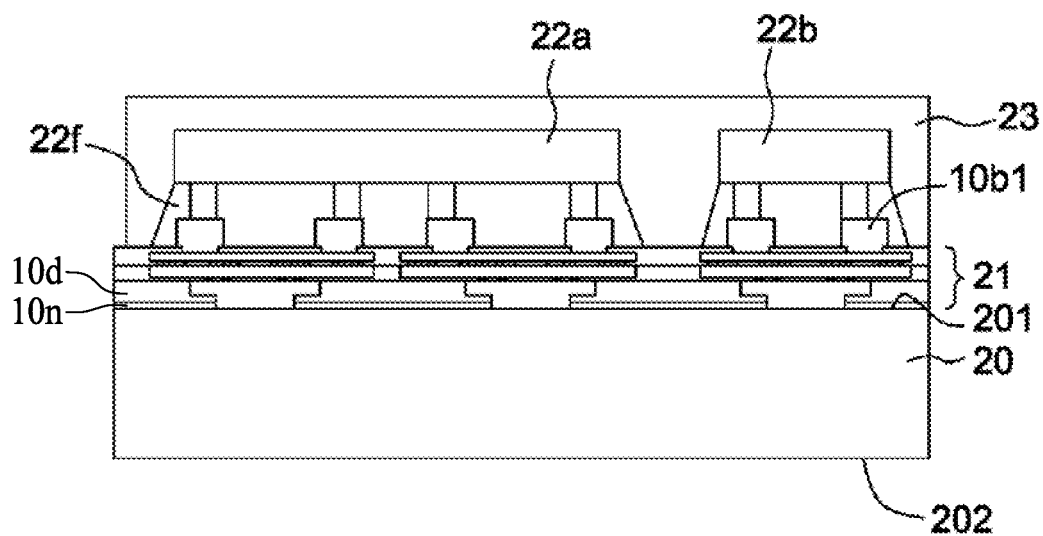

Referring to FIG. 2B, electronic components 22a, 22b are formed or disposed on the interconnection structure 21 and electrically connected to the electrical contacts 10b1 of the interconnection structure 21. Each of the electronic components 22a, 22b includes a plurality of semiconductor devices, such as, but not limited to, transistors, capacitors and resistors interconnected together by a die interconnection structure into functional circuits to thereby form an integrated circuit. As will be understood to those skilled in the art, the device side of the semiconductor die includes an active portion including integrated circuitry and interconnections. The electronic components 22a, 22b may be any suitable integrated circuit device including, but not limited to, a microprocessor (e.g., single or multi-core), a memory device, a chipset, a graphics device, or an application specific integrated circuit according to several different embodiments.

An underfill 22f is formed or disposed to cover or encapsulate the active side of the electronic components 22a, 22b and the electrical contacts 10b1 of the interconnection structure 21, and then a reflow process may be carried out. A package body 23 is then formed or disposed to cover or encapsulate the electronic components 22a, 22b. In some embodiments, the package body 23 includes an epoxy resin including fillers, a molding compound (e.g., an epoxy molding compound or other molding compound), a polyimide, a phenolic compound or material, a material including a silicone dispersed therein, or a combination thereof.

Figure 2C:
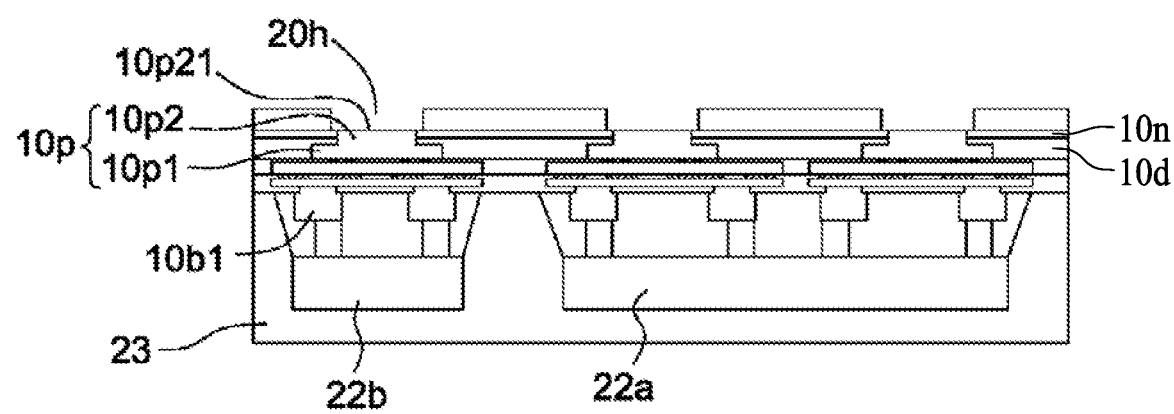

Referring to FIG. 2C, the semiconductor structure shown in FIG. 2B is inverted, and a portion of the base 20 is removed to decrease a thickness of the base by, for example, applying a grinding process to a surface (e.g., second surface) 202 of the base. In some embodiments, a thickness of the remaining portion of the base 20 is in a range from about 10 µm to about 30 µm. The remaining portion of the base 20 provides a reinforcement for the structure to reduce bending of the structure during the following process flow.

An opening 20h is formed at one or more predetermined locations of the base 20 to expose a surface 10p21 of the second portion 10p2 of the conductive pad 10p. The opening 20h can be formed by etching or other suitable processes. In some embodiments, the conductive pad 10p is completely covered by a dielectric layer. Because the base 20 and the dielectric layer are formed of different materials, two different etching processes may be carried out to respectively remove the base 20 and the dielectric layer, which would increase the manufacturing cost, time and difficulty. In accordance with some embodiments, since the surface 10p21 of the second portion 10p2 of the conductive pad 10p is not covered by the dielectric layer 10n, the conductive pad 10p can be exposed by a single etching process performed on the base 20. In other embodiments, the base 20 can be completely removed to expose the surface 10p21 of the second portion 10p2 of the conductive pad 10p.

Figure 2D:
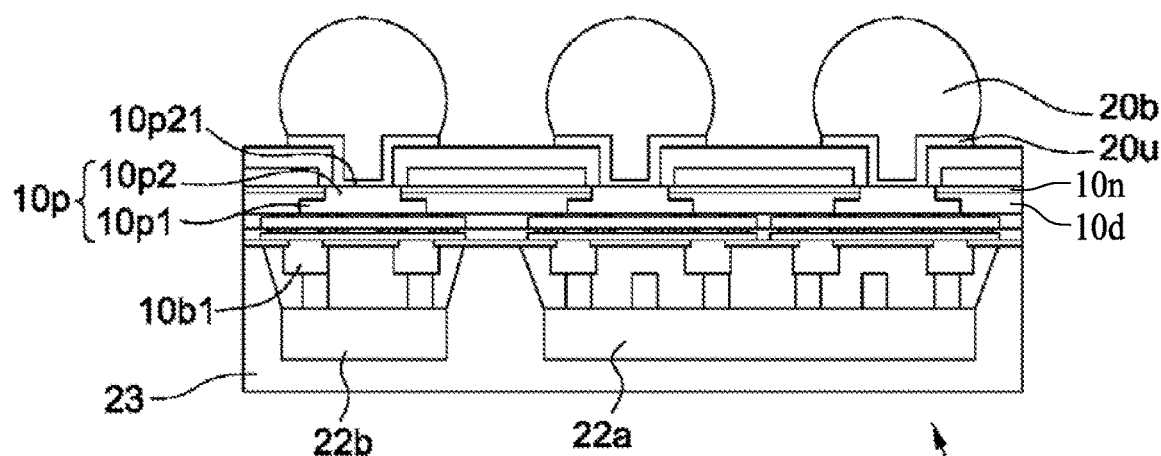

Referring to FIG. 2D, a conductive layer 20u (e.g., UBM) is formed or disposed in the opening 20h to contact the surface 10p21 of the second portion 10p2 of the conductive pad 10p, and then an electrical contact 20b (e.g., a C4 pad) is formed or disposed on the conductive layer 20u and extends into the opening 20h to form a semiconductor package device 2.

Figure 2E:
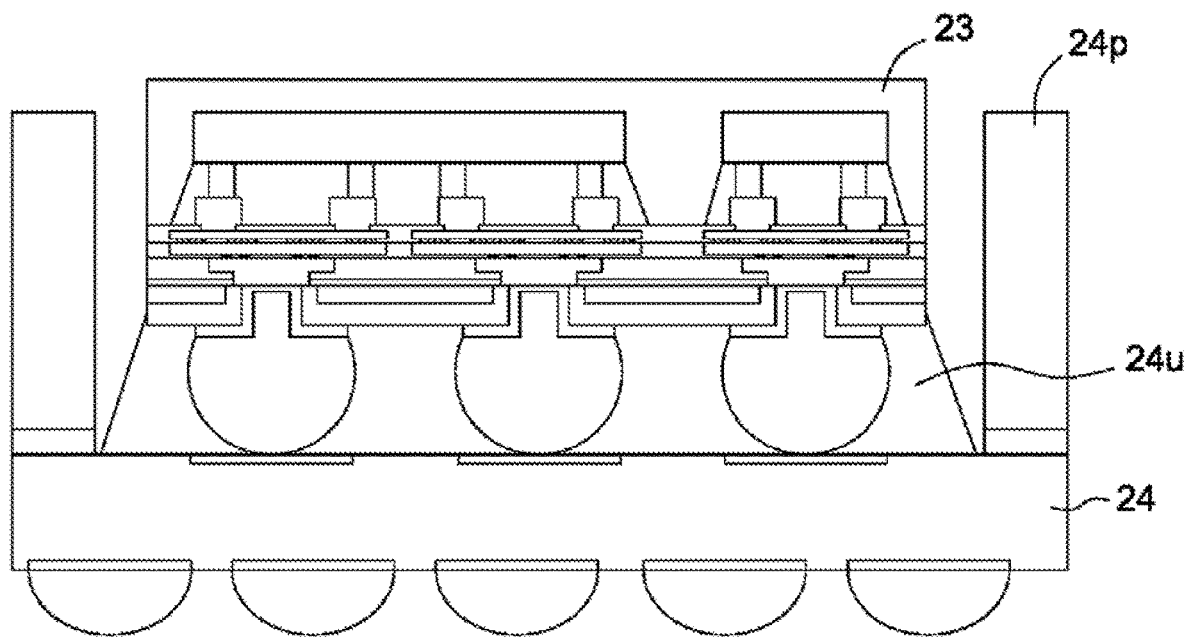

Referring to FIG. 2E, the semiconductor structure shown in FIG. 2D is connected to a substrate 24 (e.g., a BGA substrate). An underfill 24u is formed or disposed to cover or encapsulate the electrical contact 20b, and then a reflow process may be carried out. A support structure 24p may be formed or disposed along edges of the substrate 24 to prevent the semiconductor package device 2 from being cracked by another object placed on the semiconductor package device 2. In some embodiments, the processes shown in FIGS. 2A-2E are referred to as a "chip-first process."

Figure 3A:
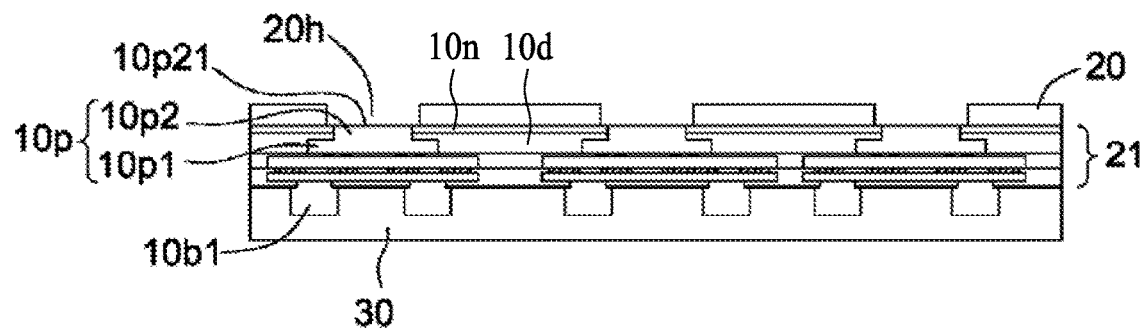
FIG. 3A, FIG. 3B and FIG. 3C illustrate a method of manufacturing a semiconductor package in accordance with some embodiments of the present disclosure.
Figure 3B:
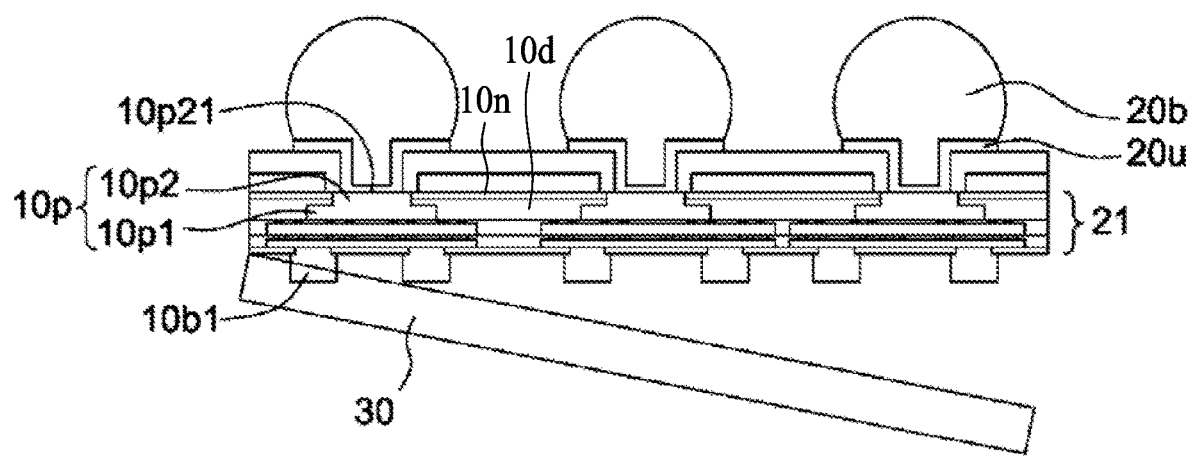
Figure 3C:
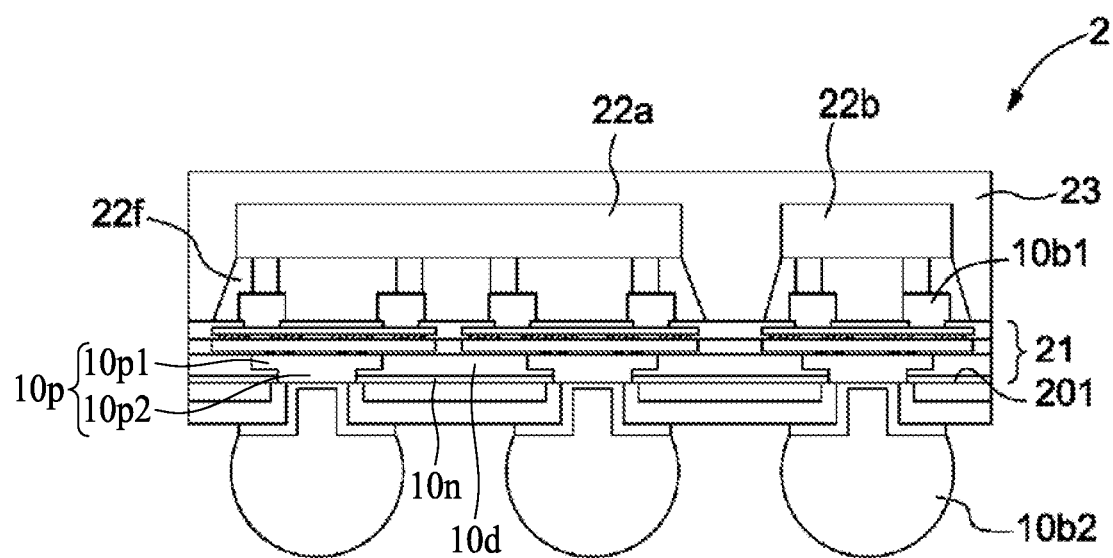

FIGS. 3A, 3B and 3C are cross-sectional views of a semiconductor structure fabricated at various stages, in accordance with some embodiments of the present disclosure. Various figures have been simplified for a better understanding of the aspects of the present disclosure. In some embodiments, the operation shown in FIG. 3A is carried out subsequent to the operation shown in FIG. 2A.

Referring to FIG. 3A, the semiconductor structure shown in FIG. 2A is inverted and the interconnection structure 21 is placed on a carrier 30. In some embodiments, the carrier 30 is a glass carrier. A portion of the base 20 is then removed to decrease a thickness of the base by, for example, applying a grinding process to a surface 202 of the base. In some embodiments, a thickness of the remaining portion of the base 20 is in a range from about 10 µm to about 30 µm. The remaining portion of the base 20 provides a reinforcement for the structure to reduce bending of the structure during the following process flow.

An opening 20h is formed at a predetermined location of the base 20 to expose a surface 10p21 of the second portion 10p2 of the conductive pad 10p. The opening 20h can be formed by etching or other suitable processes. As mentioned above, since the surface 10p21 of the second portion 10p2 of the conductive pad 10p is not covered by the dielectric layer 10n, the conductive pad 10p can be exposed by a single etching process performed on the base 20. In other embodiments, the base 20 can be completely removed to expose the surface 10p21 of the second portion 10p2 of the conductive pad 10p.

Referring to FIG. 3B, the semiconductor structure shown in FIG. 3A is inverted and the carrier 30 is removed from the interconnection structure 21. The conductive layer 20u (e.g., UBM) is formed or disposed in the opening 20h to contact the surface 10p21 of the second portion 10p2 of the conductive pad 10p, and then an electrical contact 20b (e.g., a C4 pad) is formed or disposed on the conductive layer 20u and extends into the opening 20h.

Referring to FIG. 3C, the semiconductor structure shown in FIG. 3B is inverted, and electronic components 22a, 22b are formed or disposed on the interconnection structure 21 and electrically connected to the electrical contact 10b1 of the interconnection structure 21. Each of the electronic components 22a, 22b includes a plurality of semiconductor devices, such as, but not limited to, transistors, capacitors and resistors interconnected together by a die interconnection structure into functional circuits to thereby form an integrated circuit. As will be understood to those skilled in the art, the device side of the semiconductor die includes an active portion including integrated circuitry and interconnections. The electronic components 22a, 22b may be any suitable integrated circuit device including, but not limited to, a microprocessor (e.g., single or multi-core), a memory device, a chipset, a graphics device, or an application specific integrated circuit according to several different embodiments.

An underfill 22f is formed or disposed to cover or encapsulate the active side of the electronic components 21a, 22b and the electrical contact 10b1 of the interconnection structure 21, and then a reflow process may be carried out. A package body 23 is then formed or disposed to cover or encapsulate the electronic components 22a, 22b to form a semiconductor package device 2 as shown in FIG. 3C. In some embodiments, the package body 23 includes an epoxy resin including fillers, a molding compound (e.g., an epoxy molding compound or other molding compound), a polyimide, a phenolic compound or material, a material including a silicone dispersed therein, or a combination thereof. In some embodiments, the processes shown in FIGS. 3A-3C are referred to as a "chip-last process."

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A method of manufacturing a semiconductor package, comprising:
    (a) providing a first carrier;
    (b) disposing a redistribution layer and a first electrical contact on the first carrier, wherein the first electrical contact is covered by the first carrier;
    (c) disposing a dielectric layer and a conductive pad on the redistribution layer, wherein the conductive pad is electrically connected to the redistribution layer, the dielectric layer has a second carrier thereon, and the second carrier has an opening to expose a portion of the conductive pad; and
    (d) forming a conductive layer within the opening to contact the portion of the conductive pad exposed from the second carrier.

2. The method of claim 1, further comprising forming a second electrical contact on the conductive layer and within the opening.

3. The method of claim 1, further comprising removing the first carrier from the redistribution layer to expose the first electrical contact.

4. The method of claim 3, after operation (d), further comprising connecting a die to the first electrical contact.

5. The method of claim 4, further comprising disposing an underfill between the die and the redistribution layer to cover an active surface of the die and the first electrical contact.

6. The method of claim 5, further comprising disposing an encapsulant on the redistribution layer to cover the die and the underfill.

7. The method of claim 1, wherein the conductive pad comprises a first portion adjacent to the redistribution layer and a second portion, and a surface of the second portion of the conductive pad is substantially coplanar with a surface of the dielectric layer.

8. The method of claim 7, wherein a width of the first portion of the conductive pad is greater than a width of the second portion of the conductive pad.

9. The method of claim 7, wherein:
    the dielectric layer comprises an oxide layer and a nitride layer on the oxide layer, and the surface of the second portion of the conductive pad is substantially coplanar with a surface of the nitride layer.

10. The method of claim 1, wherein operation (c) further comprises:
    removing a first portion of the second carrier; and
    forming the opening in a remaining second portion of the second carrier to expose the portion of the conductive pad.

11. The method of claim 10, wherein a thickness of the second portion of the second carrier is in a range from about 10 micrometers (μm) to about 30 μm.

12. The method of claim 10, further comprising forming the conductive layer on the second portion of the second carrier and within the opening to contact the portion of the conductive pad exposed from the second carrier.

13. The method of claim 1, wherein the conductive layer includes an under bump metallurgy (UBM) portion.

14. The method of claim 1, wherein the redistribution layer comprises an interconnection layer, and the interconnection layer comprises a via electrically connected to the conductive pad.

15. The method of claim 1, further comprising: disposing a passivation layer on a surface of the dielectric layer, the passivation layer defining a recess that exposes the portion of the conductive pad.

16. The method of claim 15, further comprising disposing a silicon layer between the passivation layer and the dielectric layer.

17. The method of claim 16, wherein the silicon layer is spaced apart from the conductive layer in a direction substantially parallel to the surface of the dielectric layer.

18. The method of claim 16, wherein the silicon layer defines a recess that exposes the portion of the conductive pad.

* * * * *